(12) United States Patent
Young et al.

(10) Patent No.: US 10,956,813 B2
(45) Date of Patent: Mar. 23, 2021

(54) COMPUTE-IN-MEMORY CIRCUIT HAVING A MULTI-LEVEL READ WIRE WITH ISOLATED VOLTAGE DISTRIBUTIONS

(71) Applicant: Intel Corporation, Santa Clara, CA (US)

(72) Inventors: Ian A. Young, Portland, OR (US); Ram Krishnamurthy, Portland, OR (US); Sasikanth Manipatruni, Portland, OR (US); Gregory K. Chen, Portland, OR (US); Amrita Mathuriya, Portland, OR (US); Abhishek Sharma, Hillsboro, OR (US); Raghavan Kumar, Hillsboro, OR (US); Phil Knag, Hillsboro, OR (US); Huseyin Ekin Sumbul, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 16/147,109

(22) Filed: Sep. 28, 2018

(65) Prior Publication Data

US 2019/0042928 A1    Feb. 7, 2019

(51) Int. Cl.
| | |
|---|---|
| *G06N 3/06* | (2006.01) |
| *G06N 3/063* | (2006.01) |
| *G11C 11/419* | (2006.01) |
| *G11C 5/06* | (2006.01) |
| *H03M 7/30* | (2006.01) |

(Continued)

(52) U.S. Cl.
CPC ........... *G06N 3/063* (2013.01); *G06N 3/0454* (2013.01); *G11C 5/063* (2013.01); *G11C 7/1006* (2013.01); *G11C 11/413* (2013.01); *G11C 11/419* (2013.01); *G11C 11/54* (2013.01); *H03M 7/6011* (2013.01)

(58) Field of Classification Search
CPC .......... G11C 5/063; G11C 5/066; G06N 3/06; G06N 3/061
See application file for complete search history.

(56) References Cited

U.S. PATENT DOCUMENTS

| | | | |
|---|---|---|---|
| 2016/0011807 A1* | 1/2016 | Seol | G11C 11/5628 711/102 |
| 2017/0017879 A1* | 1/2017 | Kataeva | G06F 11/079 |
| 2020/0035305 A1* | 1/2020 | Choi | G11C 11/54 |

OTHER PUBLICATIONS

Ambrogio, S., et al., "Equivalent-Accuracy Accelerated Neural-Network Training Using Analogue Memory," Nature, vol. 558, Jun. 7, 2018, 22 pages.

(Continued)

*Primary Examiner* — Han Yang
(74) *Attorney, Agent, or Firm* — Compass IP Law PC

(57) ABSTRACT

An apparatus is described. The apparatus includes a compute in memory circuit. The compute in memory circuit includes a memory circuit and an encoder. The memory circuit is to provide $2^m$ voltage levels on a read data line where m is greater than 1. The memory circuit includes storage cells sufficient to store a number of bits n where n is greater than m. The encoder is to receive an m bit input and convert the m bit input into an n bit word that is to be stored in the memory circuit, where, the m bit to n bit encoding performed by the encoder creates greater separation between those of the voltage levels that demonstrate wider voltage distributions on the read data line than others of the voltage levels.

20 Claims, 12 Drawing Sheets

(51) Int. Cl.
    *G11C 11/413*    (2006.01)
    *G11C 7/10*    (2006.01)
    *G11C 11/54*    (2006.01)
    *G06N 3/04*    (2006.01)

(56) References Cited

OTHER PUBLICATIONS

Biswas, A., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 488-490.

Fick, D., et al., "Analog Computation in Flash Memory for Datacenter-Scale AI Inference in a Small Chip", 2.05 Mythic Hot Chips, 2018, 28 pages.

Henzler, S., "Chapter 2, Time-to-Digital Converter Basics", Springer Series in Advanced Microelectronics 29, 2, Springer Science+Business Media B.V. 2010.

Kang, M., et al., "An In-Memory VLSI Architecture for Convolutional Neural Networks", http://ieee-cas.org/pubs/jetcas, Published Version DOI: 10.1109/JETCAS.2018.2829522, Publication Apr. 23, 2018, IEEE Circuits and Systems Society, 13 pages.

Mason, A., "Memory Basics", Michigan State, ECE 410, Chapter 13 Lecture Notes, pp. 13.1-13.34, 2010.

Solanki, Umang, "How does SRAM work?", https://www.quora.com/How-does-SRAM-work, Aug. 17, 2017, 2 pages.

Stone, Harold S. "A Logic-in-Memory Computer", IEEE Transactions on Computers, Jan. 1970, 6, pages.

Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.

Gonugondia, Sujan Kumar, et. al., "A 42pJ/Decision 3.12TOPS/W Robust in-Memory Machine Learning Classifier with On-Chip Training", ISSCC 2018, Session 31, Computation in Memory for Maching Learning, 31.2, IEEE, Feb. 14, 2018, 3 pages.

\* cited by examiner

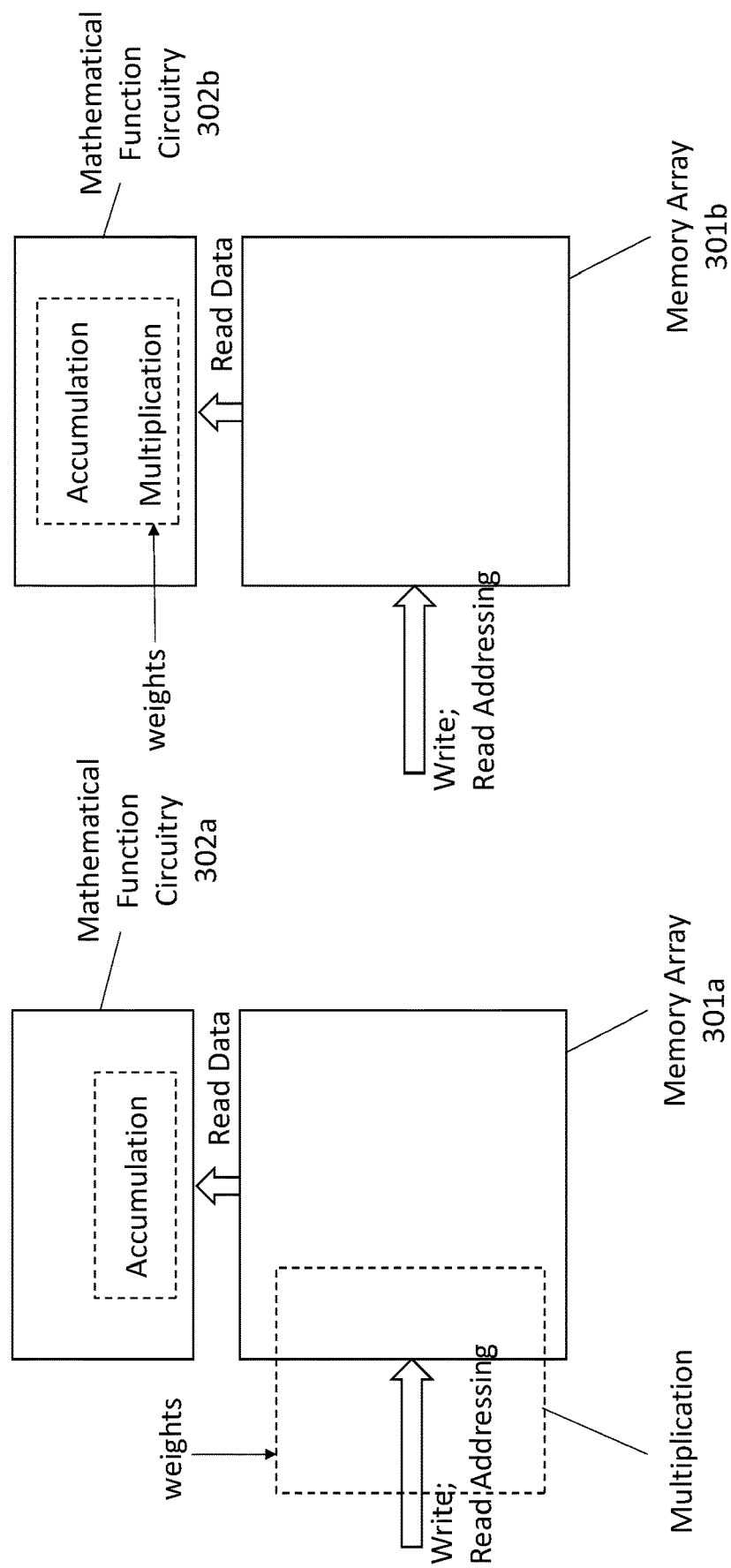

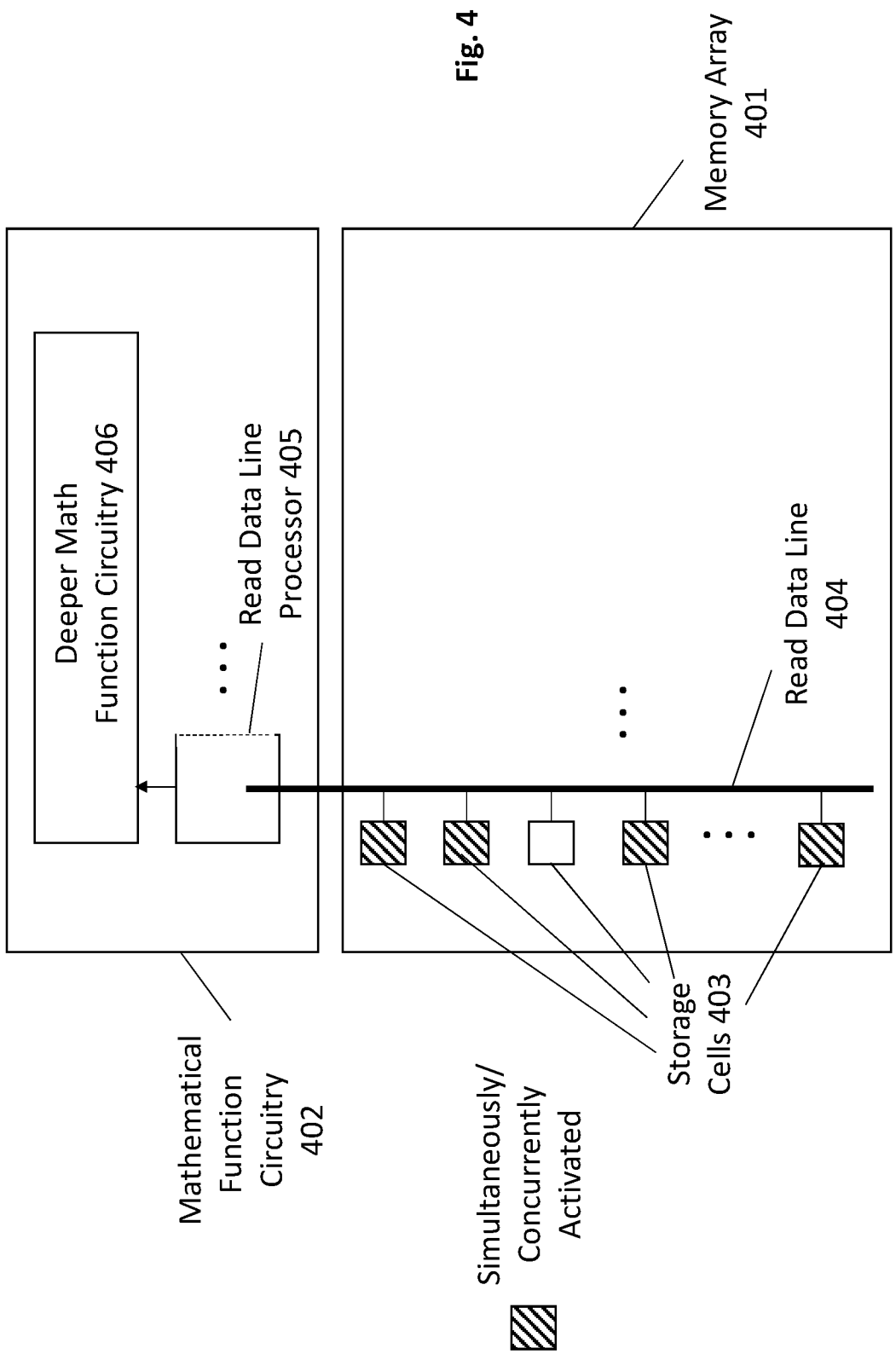

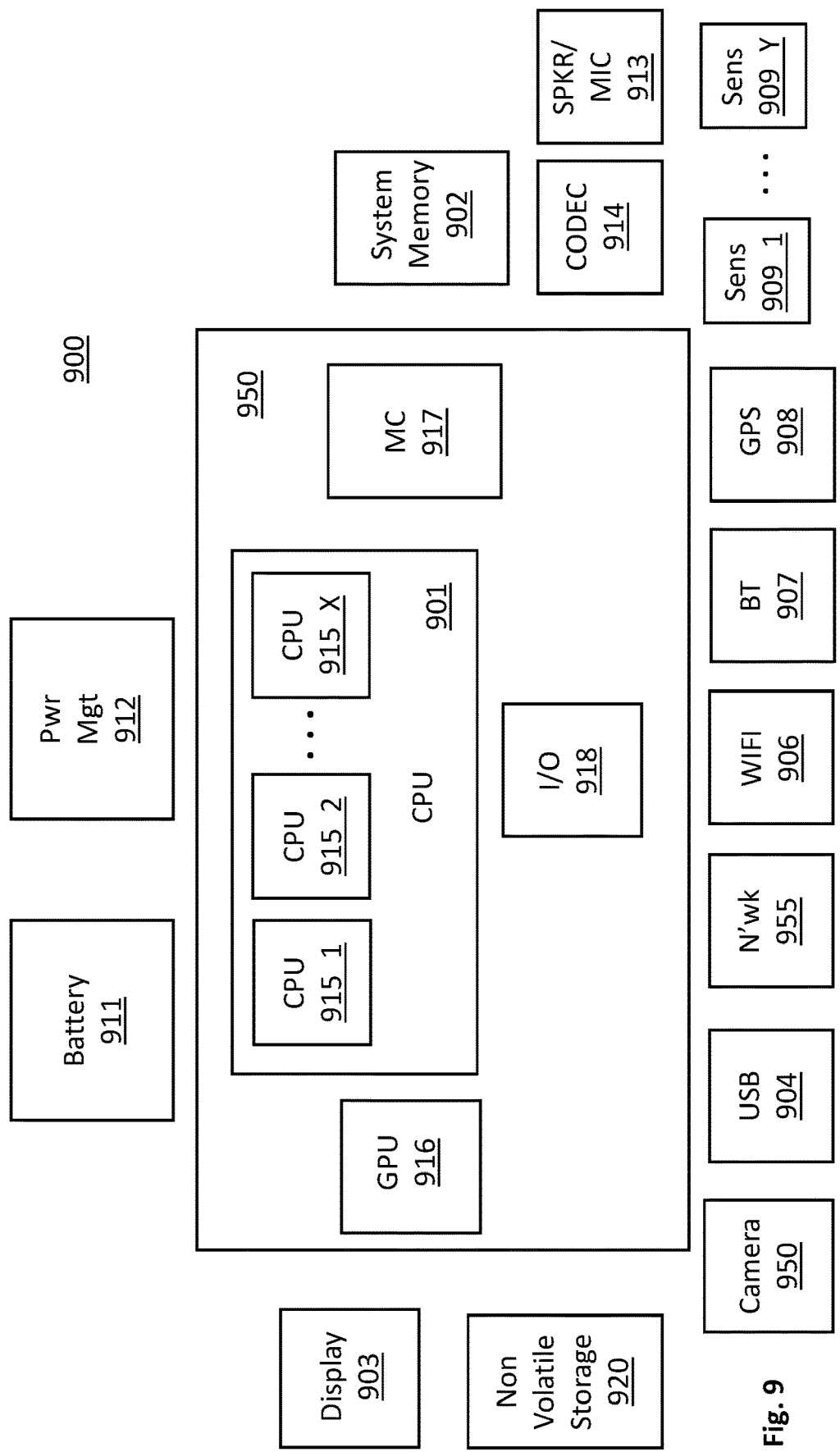

COMPUTE-IN-MEMORY CIRCUIT HAVING A MULTI-LEVEL READ WIRE WITH ISOLATED VOLTAGE DISTRIBUTIONS

FIELD OF INVENTION

The field of invention pertains generally to the computer sciences, and, more specifically, to a compute-in-memory circuit having a multi-level read wire with isolated voltage distributions.

BACKGROUND

With the continually decreasing minimum feature size dimensions and corresponding continually increasing integration levels achieved by modern day semiconductor manufacturing processes, artificial intelligence has emerged as the next significant reachable application for semiconductor based computer processing. Attempting to realize semiconductor based artificial intelligence, however, creates motivations for new kinds of semiconductor processor chip designs.

FIGURES

A better understanding of the present invention can be obtained from the following detailed description in conjunction with the following drawings, in which:

FIGS. 3a and 3b shows exemplary compute-in-memory hardware circuit architectures;

FIG. 4 shows an exemplary read data line in a compute-in-memory circuit;

FIG. 9 shows a computing system.

DETAILED DESCRIPTION

Figure 1:
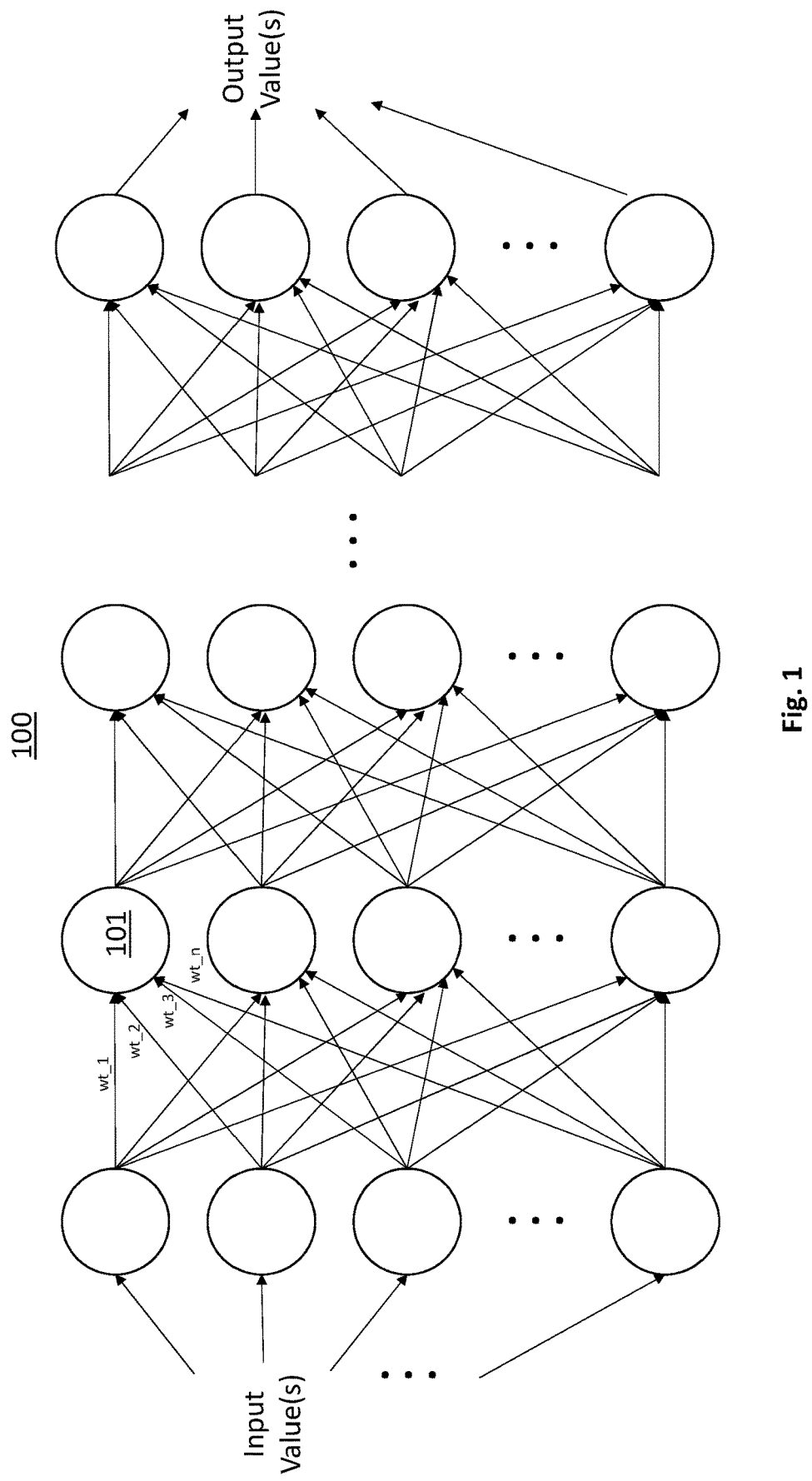
FIG. 1 shows a neural network.
Figure 2C:
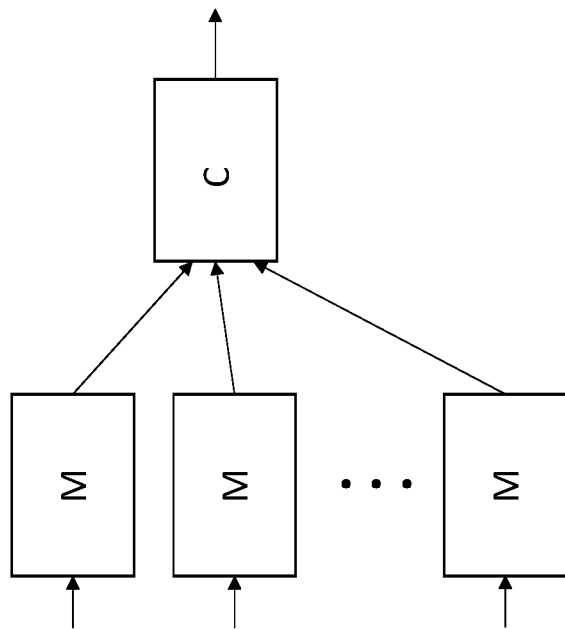
FIGS. 2a, 2b, 2c, 2d, 2e, 2f, 2g show various high-level compute-in-memory circuit structures.
Figure 2A:
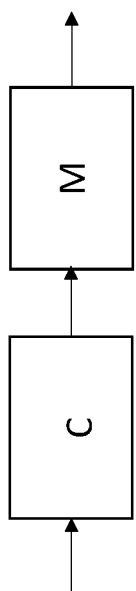
Figure 2B:
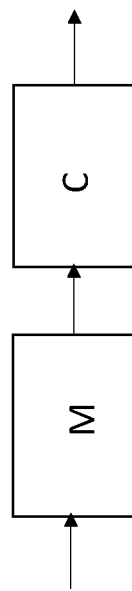
Figure 2E:
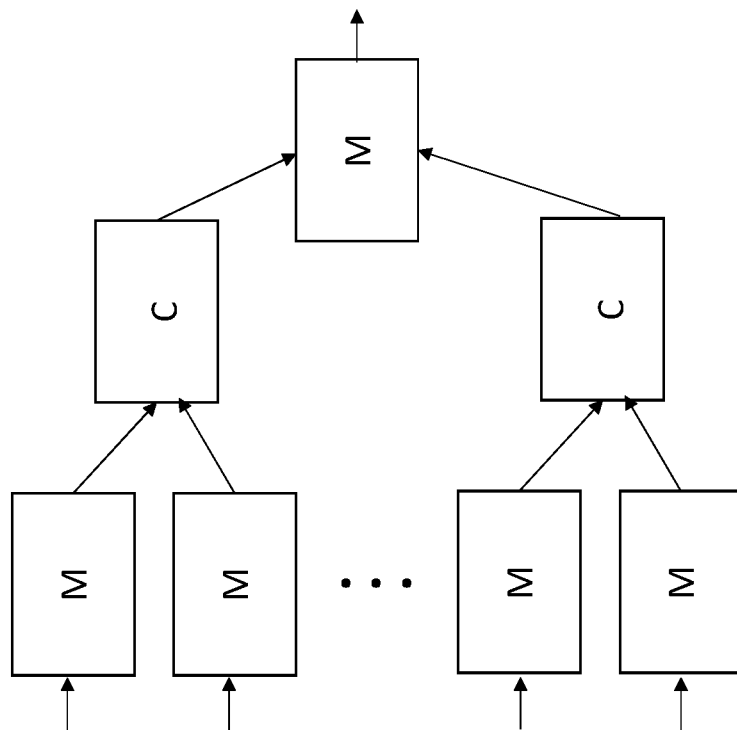
Figure 2D:
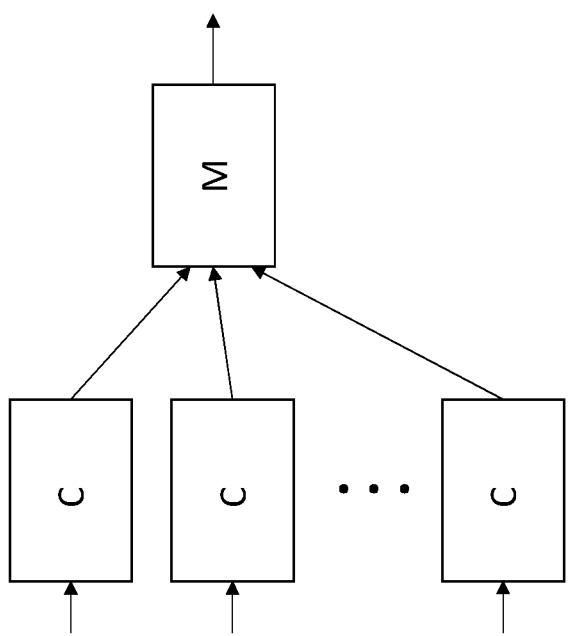
Figure 2G:
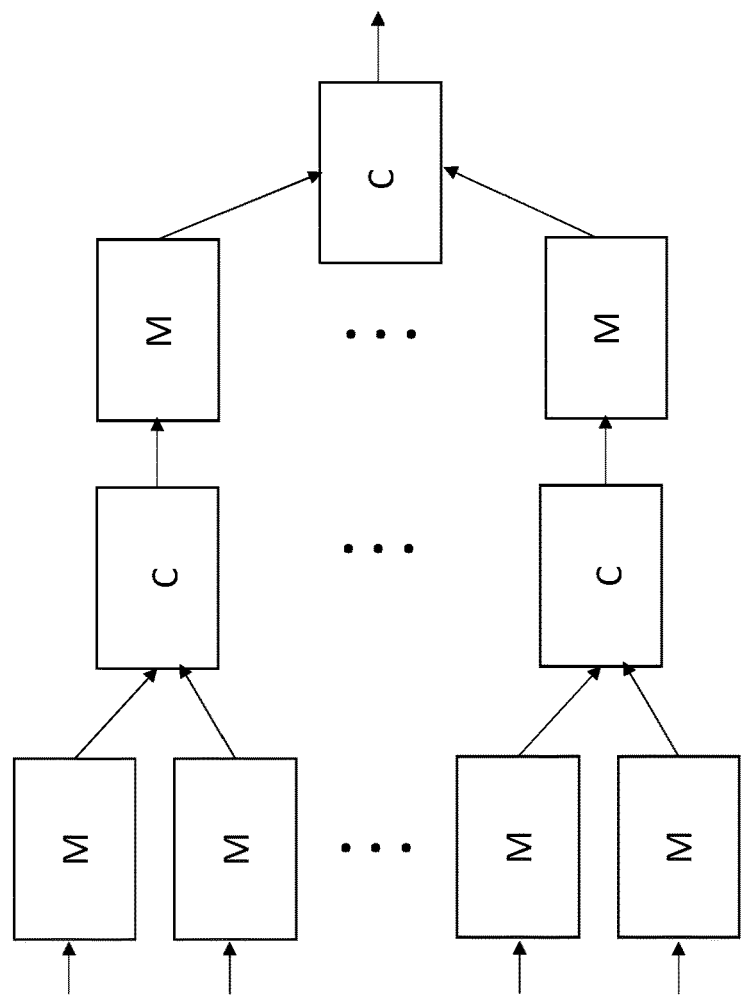
Figure 2F:
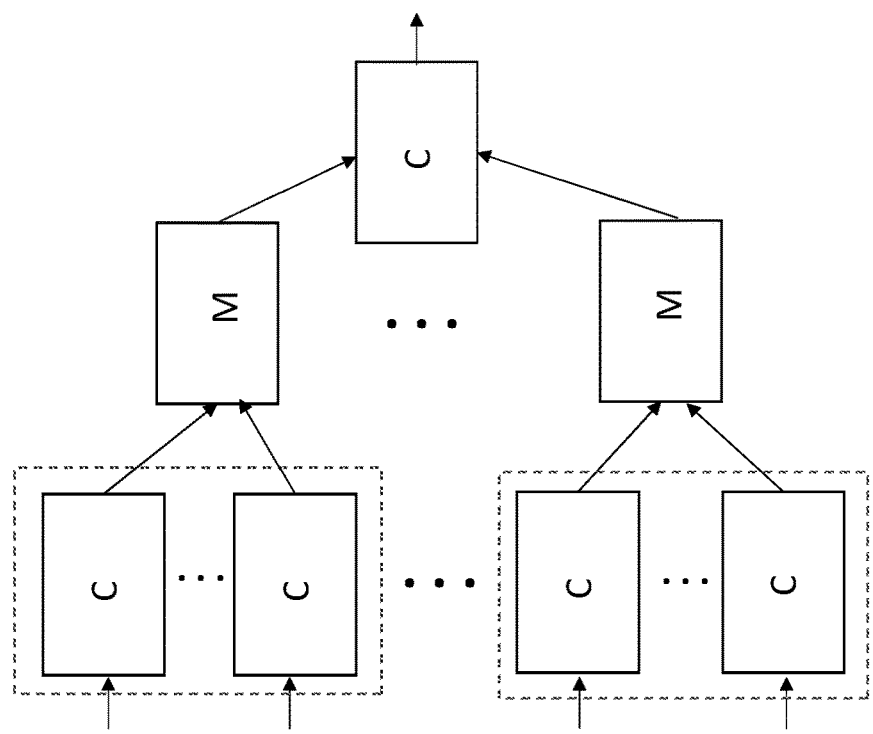

A neural network is the basic computational structure for Artificial Intelligence (AI) applications. FIG. 1 depicts an exemplary neural network 100. As observed in FIG. 1 the inner layers of a neural network can largely be viewed as layers of neurons that each receive weighted outputs from the neurons of other (e.g., preceding) layer(s) of neurons in a mesh-like interconnection structure between layers. The weight of the connection from the output of a particular preceding neuron to the input of another subsequent neuron is set according to the influence or effect that the preceding neuron is to have on the subsequent neuron (for ease of drawing only one neuron 101 and the weights of input connections are labeled). Here, the output value of the preceding neuron is multiplied by the weight of its connection to the subsequent neuron to determine the particular stimulus that the preceding neuron presents to the subsequent neuron.

A neuron's total input stimulus corresponds to the combined stimulation of all of its weighted input connections. According to various implementations, the combined stimulation is calculated as a multi-dimensional (e.g., vector) multiply accumulate operation. Here, output values from preceding neurons are multiplied by their respective weights to produce a set of products. The set of products are then accumulated (added) to generate the input stimulus to the receiving neuron. A (e.g., non-linear or linear) mathematical function is then performed using the stimulus as its input which represents the processing performed by the receiving neuron. That is, the output of the mathematical function corresponds to the output of the neuron which is subsequently multiplied by the respective weights of the neuron's output connections to its following neurons. The neurons of some extended neural-networks, referred to as "thresholding" neural networks, do not trigger execution of their mathematical function unless the neuron's total input stimulus exceeds some threshold. Although the particular exemplary neural network of FIG. 1 is a purely "feed forward" structure, other neural networks may exhibit some backwardization or feedback in their data flows.

Notably, generally, the more connections between neurons, the more neurons per layer and/or the more layers of neurons, the greater the intelligence the network is capable of achieving. As such, neural networks for actual, real-world artificial intelligence applications are generally characterized by large numbers of neurons and large numbers of connections between neurons. Extremely large numbers of calculations (not only for neuron output functions but also weighted connections) are therefore necessary in order to process information through a neural network.

Although a neural network can be completely implemented in software as program code instructions that are executed on one or more traditional general purpose central processing unit (CPU) or graphics processing unit (GPU) processing cores, the read/write activity between the CPU/GPU core(s) and system memory that is needed to perform all the calculations is extremely intensive. In short, the overhead and energy associated with repeatedly moving large amounts of read data from system memory, processing that data by the CPU/GPU cores and then writing resultants back to system memory, across the many millions or billions of computations needed to effect the neural network is far from optimal.

In order to dramatically improve upon this inefficiency, new hardware architectures are being proposed that dramatically reduce the computational overhead associated with implementing a neural network with a traditional CPU or GPU.

One such electronic circuit is a "compute-in-memory" (CIM) circuit that integrates mathematical computation circuits within a memory circuit (and/or integrates memory cells in an arrangement of mathematical computation circuits). FIGS. 2a through 2g show some possible, exemplary CIM unit cell blocks. Here, data that is stored in the memory cells (M) of a CIM circuit, which may correspond, e.g., to a connection weight, neuron output value, a product of a neuron output value and its corresponding weight, a neuron input stimulus, etc. is computed upon by mathematical computation circuitry (C) that physically resides near the memory cell where the data was stored. Likewise, data that is stored after being computed is generally stored in memory cell(s) that physically reside near the mathematical computation circuitry that calculated the data. The mathematical computation circuits may perform digital (binary logic) computations, linear/analog computations and/or some combination of the two (mixed signal computations). To the extent the CIM circuit computes both in digital and analog domains, the CIM circuit may also include analog-to-digital circuits and/or digital-to-analog circuits to convert between the two domains. For simplicity such circuits are not depicted in FIGS. 2a through 2g.

Here, for example, the mathematical computation circuitry that implements the mathematical function of a particular neuron may be physically located: i) near the memory cell(s) where its output value is stored; ii) near the memory cells where its output connection weights are stored; iii) near the memory cells where its input stimulus is stored; iv) near the memory cells where its preceding neurons' output values are stored; v) near the memory cells where its input connection weights are stored; vi) near the memory cells where the products of the neuron's preceding neurons' output values and their respective weights are stored; etc. Likewise, the input and/or output values to/from any particular connection may be stored in memory cells that are near the mathematical computation circuitry that multiplies the connection's weight by its input value.

By chaining or otherwise arranging large numbers of CIM unit cells (such as any one or more of the CIM unit cells of FIGS. 2a through 2g and/or variations of them) consistent with the discussion above in a pattern that effects a neural network an overall CIM neural network hardware circuit can be realized. Importantly, by keeping the memory cells that store data in close proximity to the circuits that generate and/or perform calculations on the data, e.g., in minimal distances achievable by a leading edge semiconductor logic and/or memory manufacturing process, the efficiency at which information can be processed through a CIM neural network is dramatically superior to an approach that implements a neural network entirely in software on a traditional computer system. Again, note that the unit cells of FIGS. 2a through 2g are only exemplary and CIM circuits having other structures are also possible.

FIGS. 3a and 3b present two exemplary high level CIM circuit architectures. As observed in FIGS. 3a and 3b, both CIM circuits include a memory array 301 that is coupled to mathematical function circuitry 302. During a first phase values are written into the memory array 301. During a second phase values are read from the memory array 301 (commonly multiple values are read in parallel). During a third phase the mathematical function circuitry 302 performs computations on the values that were read from the memory array 301. Often, the mathematical circuitry 302 has one or more outputs that represent the output values of one or more neurons in the neural network.

Here, irrespective of whether the CIM circuit of FIG. 3a or 3b is purely binary, operates with more than two discrete levels or is a purely linear/analog circuit, and/or, irrespective of exactly what kinds of values are stored in the memory array 301 (e.g., just connection values, connection values and weights, products of connection values and weights, etc.), both the mathematical circuitry 302 and the precise interconnection structure between the memory array 301 and the mathematical circuitry 302 may be designed according to a number of different architectures.

Generally, however, the memory array 301 and mathematical circuitry 302 are designed to implement a (e.g., large scale) vector multiply accumulate operation in order to determine a neuron's input stimulus. Again, the multiplication of the connection values against their respective weights corresponds to the multiply operation and the summation of the resultant end-products corresponds to the accumulate operation.

According to the first architecture of FIG. 3a, the multiply operation is performed explicitly with multiplication circuitry that precedes the memory array 301a and/or is effectively performed by the manner in which the memory array 301a is accessed (e.g., during a memory read). The mathematical function circuitry 302a then determines the accumulated value (an accumulated value may be presented on a read data line that the mathematical function circuitry senses). In the architecture of FIG. 3a, a vector of weight values is processed by circuitry that precedes the memory array (e.g., a row decoder of the memory array).

By contrast, according to the architecture of FIG. 3b, the mathematical function circuitry 302b determines both the multiplication terms and the accumulation result. That is, the data that is read from the memory array 301b needs to be both multiplied and accumulated by the mathematical function circuitry 302b. As such, a vector of weight values is presented to and processed by the mathematical function circuitry.

FIG. 4 shows another more detailed hardware design that can be utilized a CIM having the architecture of FIG. 3a or 3b. As observed in FIG. 4, the memory array 401 includes an array of memory cells 403, where, e.g., memory cells associated with a same memory dimension, such as an array column, are coupled to a same read data line 404. As is known in the art, in a traditional memory, memory cells that are coupled to a same read data line (such as memory cells along a same column that are coupled to a same bit line) can only be accessed one at a time. That is, e.g., only one row is activated during a read so that the data of only one cell is sensed on the bit line that is coupled to other cells along different rows.

By contrast, in the architecture of FIG. 4, multiple cells 403 that are coupled to a same read data line 404 can be simultaneously or at least concurrently activated during a same read operation so that the data stored by the multiple cells affects the voltage and/or current on the read data line 404 which, in turn, reflects some combined state of the cells' data. According to one application which can be used by the CIM architecture of either FIG. 3a or FIG. 3b, the CIM circuit utilizes more than two discrete voltage levels (e.g., four levels, eight levels, etc.) and the activation of multiple binary cells are combined on the same read data line 404 to establish one of these levels.

According to another application for use in the architecture of FIG. 3a, the combined state corresponds to an accumulation value. That is, the read data line 404 presents an accumulation value that is sensed by the mathematical function circuitry. As just one example, in CIM circuit that implements a purely digital neural network, connection values are either a 1 or a 0 and weights are either a 1 or a 0. During a multiply accumulate operation, the values of the different connections that feed into a same neuron are stored in the different memory cells 403 of a same column.

A vector of the weight values is then presented to the row decoder of the memory array 401 which only activates, for a read operation, those rows whose corresponding vector element has a weight of 1. The simultaneous/concurrent read of the multiple selected rows causes the read data line 404 to reach a value that reflects the accumulation of the values stored in the memory cells of only the selected rows. In essence, the selection of only the rows having a weight of 1 corresponds to a multiply operation and the simultaneous read of the selected rows onto the same read data line 404 corresponds to an accumulate operation. The accumulated value on the read data line 404 is then presented to the mathematical function circuitry 402 which, e.g., senses the accumulated value and then performs a subsequent math function such as a neuron math function.

As depicted in FIG. 4, read data line processing circuitry 405 is positioned toward the front end of the mathematical circuity 402 to sense read data line values. The read data line processing circuitry 405 may be partitioned in various ways.

For example, there may be one instance of read data line processing circuitry per read data line, or, there may be one instance of read data line processing circuitry for multiple read data lines (e.g., to accumulate values across multiple read data lines). If the mathematical function circuitry 402 is to simultaneously process the math functions of multiple neurons the read data line processing circuitry 405 may also be partitioned such that read data line processing operations for different neurons are isolated from one another.

Read data line processing circuitry 405 is then coupled to deeper math function circuitry 406 which, e.g., performs neuron math functions. In various embodiments, the boundary between the read data line processing circuitry 405 and the deeper math circuitry 406 is crossed with an input stimulus value for a neuron. The deeper math function circuitry 406 may also be partitioned, e.g., along boundaries of different neurons and/or different math functions.

It is important to point out that the hardware architecture of FIG. 4 is just one example of many different hardware architectures that are possible according to the more general hardware architectures of FIGS. 3a and 3b.

Figure 5:
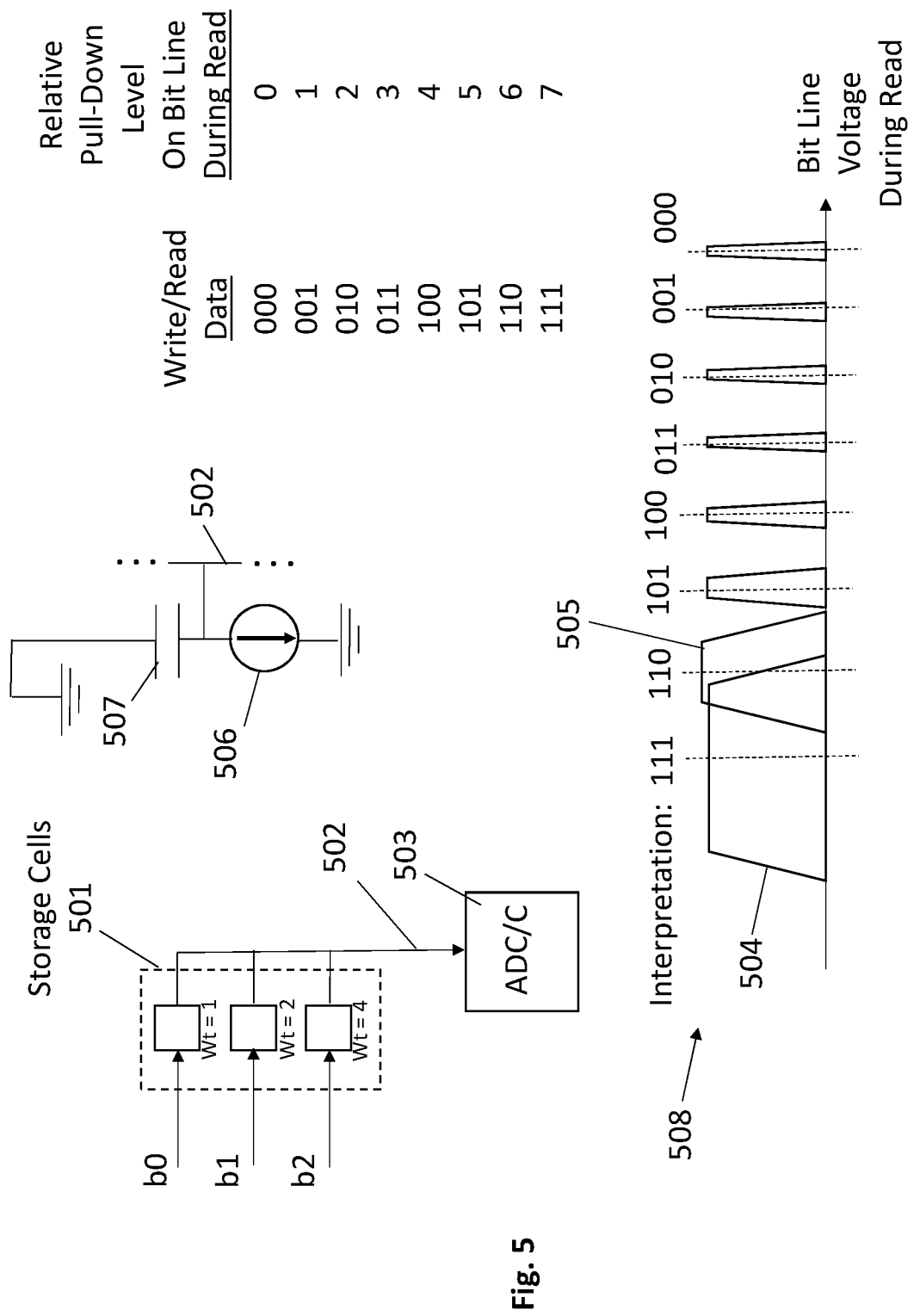
FIG. 5 shows a multi-level memory circuit.

FIG. 5 shows a prior art CIM cell approach in which the data stored by the memory circuit 501 is to be interpreted by more than two values even though only a single read data line 502 is used to sense the read data. Here, providing more than two values (e.g., eight as observed in FIG. 5) on a single read data line 502 is a physically efficient way of reading significant amounts of information out of the memory with minimal wiring.

According to the prior art CIM of FIG. 5, multiple memory cells 501 are coupled to the single read data line 502 and store an m bit value (or "word") where $2^m$ is equal to the number of different, discrete values that can be sensed on the read data line 502. For example, as observed in the particular circuit of FIG. 5, three single bit memory cells 501 are coupled to a single read data line 502. The use of three bits corresponds to eight different values that can be stored in the memory circuit and correspondingly, eight different levels that can be sensed on the read data line 502 during a read operation (i.e., $2^3=8$).

For instance, a stored logic word of 000 corresponds to a first relative read data line voltage level ("0"); a stored logic word of 001 corresponds to a second relative read data line voltage level ("1"); a stored logic word of 010 corresponds to a third relative read data line voltage level ("2"); a stored logic word of 011 corresponds to a fourth relative read data line voltage level ("3"); . . . and a stored logic word of 111 corresponds to an eighth relative read data line voltage level ("7").

In the circuit depicted in FIG. 5, during a read operation, a storage cell can be modeled as a pull down current source 506 coupled to a capacitor 507 that is tied to the read data line. If the storage cell is storing a "0", the current source 506 is OFF and the read data line voltage is not pulled down by the storage cell. If the storage cell is storing a "1", the current source 506 is ON and the read data line voltage is pulled down by the storage cell.

The voltage amount that the read data line is pulled down by is a function of the pull down strength of the current source 506 and the amount of time that the current source 506 is ON. More precisely, the voltage drop across the capacitor 507 when the current source is ON can be viewed as being proportional to the integral of the current pulled by the current source 506 over the time that the current source is ON.

In order to create more than two different voltage levels that can be sensed on the read data line, each next higher ordered bit position in the stored word is designed to pull down the read data line by a factor of 2 more than its immediately lower ordered bit position. That is, for example, if the lowest ordered bit position storage cell is designed to pull the read data line down by 1 voltage unit (e.g., 0.1 v) if it is storing a 1, then, the middle ordered bit position storage cell is designed to pull the read data line down by 2 voltage units (e.g., 0.2 v) if it is storing a 1, and, the highest ordered bit position storage cell is designed to pull the read data line down by 4 voltage units (e.g., 0.4 v) if it is storing a 1.

Increasing the amount of pull down across the different storage cells can be effected by increasing the pull down strength of the respective cell's pull down current source and/or increasing the time that the pull down current source remains ON as compared to its lower bit position storage cell.

Increasing the voltage amount that the read data line is pulled down by a factor of 2 with each increasing bit position effectively creates linearly separated resultant voltage distributions on the read data line as a function of the stored voltage word in the three bit cell. Here, inset 508 shows eight different voltage distributions for each of the eight different stored states that the three bit storage cell can hold. Ideally, an analog-to-digital converter (ADC) or analog computation unit (C) that is coupled to the read data line 502 is able to sense which one of the eight different voltage levels is present on the read data line 502 and subsequently perform the correct conversion/calculation from it.

Unfortunately, as seen in inset 508, in actual implementation, the deepest pulled down voltage levels 504, 505 of the higher ordered bit cells results in wider read data line voltage distributions. The wider voltage distributions 504, 505 are a consequence of the more aggressive pull down magnifying any error from, e.g., process tolerances and/or environmental tolerances that exist in the operating circuit. Said another way, viewing such tolerances as introducing variations in what the resultant read data line voltage will be, the variations from each of the activated pull-down cells are accumulated which results in a wider distribution of possible voltage levels that the read data line voltage is actually pulled down to.

Even with normal tolerances, the respective distributions of the lowest read data line voltage levels 504, 505 (when the highest ordered bit(s) are activated), can overlap the respective distributions of neighboring voltage levels which renders the multi-level read data line 502 not suitable for actual use (the down stream ADC or computation unit cannot repeatedly/reliably interpret the correct read data line voltage level for every read sense operation). In essence, the power of two magnification of pull down level with each next higher ordered bit position only linearly separates the different voltage levels, and, the linearly spaced distances do not sufficiently isolate the distributions given their width/variation.

Figure 6:
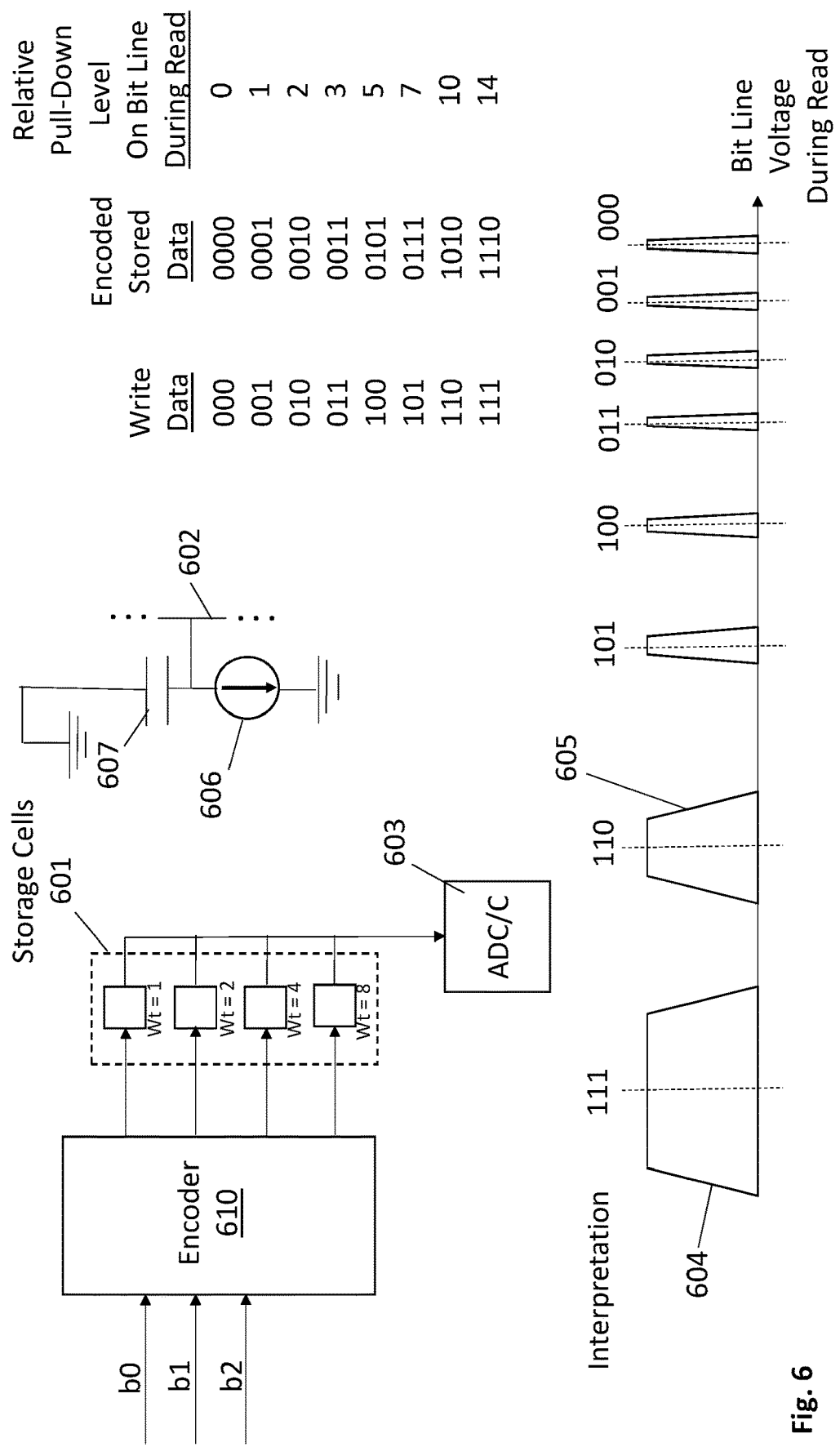
FIG. 6 shows an improved multi-level memory circuit.

FIG. 6 shows an improved circuit that introduces an extra storage cell to effect non-linear separation of the read data line voltage distributions. Here, comparing the approaches of FIGS. 5 and 6, note that whereas the approach of FIG. 5 has a number of discrete read data line voltage levels that equals $p=2^m$ where m is the number of storage cells in the memory circuit, by contrast, with the approach of FIG. 6, there are less discrete read data line voltage levels than different possible states that can be stored in the storage cells. That is, if the number of storage cells is n, the number of discrete read data line voltage levels that are to be presented on the read data line is less than $2^n$. In the particular example of FIG. 6, n=4. Here, $2^4$ corresponds to sixteen different possible stored states but only eight different voltage levels are to be generated on the read data line (whereas the number of stored states is $2^n$, the number of voltage levels is $2^m$ where m is n−1).

Here, the increased numerical range made possible by the extra stored bit is used to provide more separation between the deepest read data line voltages so that the aforementioned overlap between neighboring distributions is avoided.

Here, the mathematical circuitry of the CIM cell that the storage circuit is a component of or is coupled to may only implement a three-bit system (eight different levels/states). Thus, in operation, the storage circuit receives a three-bit value for storage. An encoder 610 that precedes the storage cells 601 then maps the three bit input value to a four bit code. In the embodiment of FIG. 6, the four bit code maintains linear separation of the shallower pull down levels because the shallower pull down levels have less associated error and therefore exhibit narrower voltage distributions.

However as the three bit input increasingly corresponds to deeper pull down levels on the read data line (upon readback), the encoder 610 stores the four bit code with increasing non linear separation between neighboring codes. So doing effectively provides more separation between the (wider) distributions 604, 605 of the deeper levels which, in turn, prevents their overlap resulting in a reliable and fully operational/working circuit. As with the approach of FIG. 5, the storage cell of a particular bit position is designed to impose twice the pull down as the storage cell of its immediate next lower bit position. However, alternative embodiments can impose more or less difference amongst storage cells of neighboring bit positions.

Note that, upon read back, the different voltage levels may, e.g., be processed outright by an analog computation circuit and/or be processed by an analog-to-digital converter (ADC) that converts the sensed read data line back to the correct three bit value that was originally presented as an input, encoded by the encoder and stored as a four bit value in the storage circuit.

Those of ordinary skill will understand that other implementations may use different numbers of input bits and output bits than the specific embodiment of FIG. 6. Additionally, other implementations may use different degrees of separation between neighboring codes than the specific separations observed in FIG. 6.

Further still, the embodiment of FIG. 6, like the approach of FIG. 5, relies upon a storage cell in which a stored logical "1" causes a pull-down current source to pull current through a capacitor that is coupled to the supply voltage and the read data line is coupled between the capacitor and the current source. Other embodiments, however, may include storage cell circuity that can be modeled differently (e.g., a "0" causes the current source to pull current down, or, the capacitor is replaced with a pull-up current source and the current source is replaced with a capacitor, etc.).

In various ones of such embodiments, larger binary input values may correspond to shallower pull down levels and/or the wider distributions needing more separation may be closer to the supply voltage (are shallower) rather than farther from the supply voltage. As such, un-like the specific embodiment of FIG. 6 in which higher binary input value corresponds to deeper pull down voltage needing more separation, by contrast, other embodiments may exist where, e.g., higher binary input value corresponds to shallower pull down voltage and/or lower binary input value requires more code separation.

Figure 7:
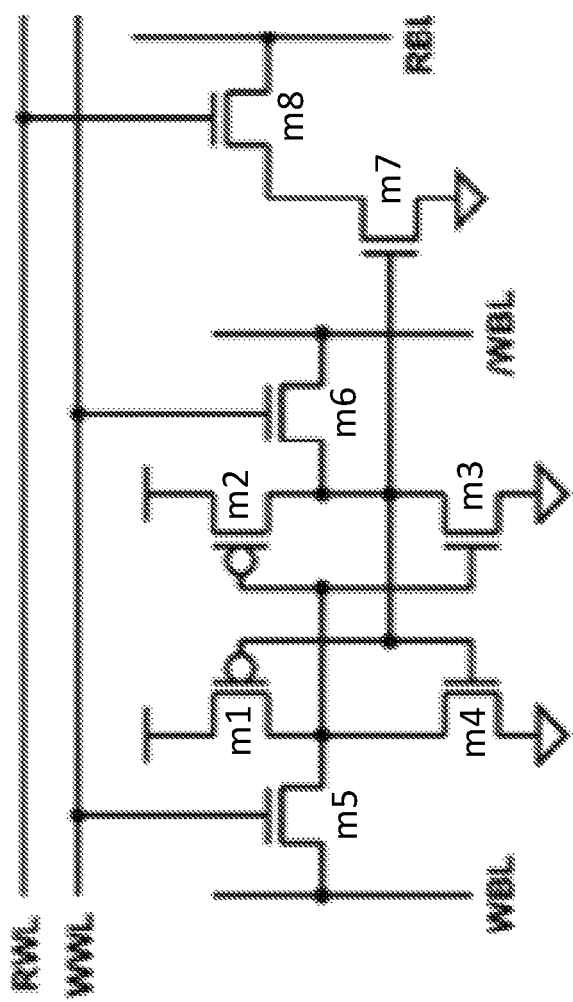
FIG. 7 shows an 8T SRAM cell.

FIG. 7 shows an embodiment of an 8T static random access memory (SRAM) cell which may be used to implement any of the storage cells of the embodiment of FIG. 6. Here, pull down strength may be increased for storage cells that hold higher ordered bits by any of: i) comparatively increasing the size of transistor m7 (to increase the current source's pull down current); ii) increase the pulse width on the read word line (RWL) to increase the amount of time that the current source pulls current through the capacitance of transistor m8; iii) increasing the supply voltage provided to the higher ordered bit cells; iv) increasing the read wordline voltage applied to the higher ordered bit cells. Transistors m1-m4 form a latch that holds the stored bit value and transistors m5 and m6 act of access transistors for the latch when the latch is written to differentially.

In other embodiments a 10T SRAM cell may be used in which two more transistors and another read data line are added which are driven from the voltage state between transistors m2 and m3. That is whereas the 8T approach provides a single ended read, by contrast, the 10T approach provides a differential read. The differential read approach increases read wiring density but should provide for faster read times (owing, e.g., to increased signal-to-noise ratio for the differential as opposed to single ended read sense).

In yet other embodiments a 6T SRAM cell may be used. A 6T SRAM cell eliminates m7 and m8 in FIG. 7 such that both write data and read data are provided on the "WBL" and "/WBL" lines depicted in FIG. 7.

In yet other embodiments, the storage cells may be implemented with dynamic random access memory (DRAM) cells or an emerging non volatile random access memory technology such as a resistive random access memory (ReRAM), ferroelectric random access memory (FeRAM), magnetic random access memory (MRAM), dielectric random access memory, phase change memory, etc. Note that emerging non volatile memories are generally capable of three dimensional storage structures in which storage cells are stacked upon one another in the metallurgy above the semiconductor die substrate.

Figure 8A:
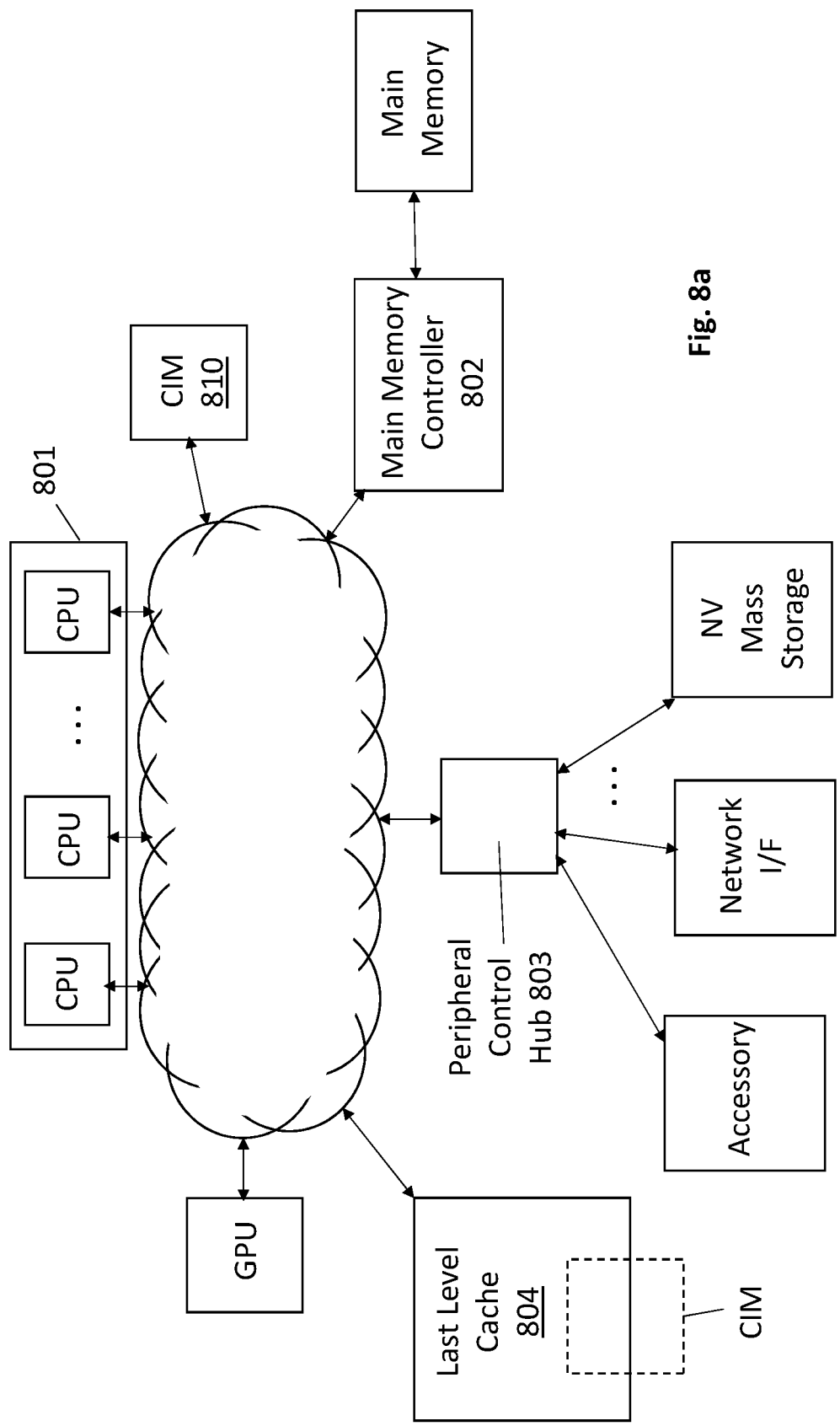
FIGS. 8a and 8b shows exemplary applications of a compute-in-memory circuit.
Figure 8B:
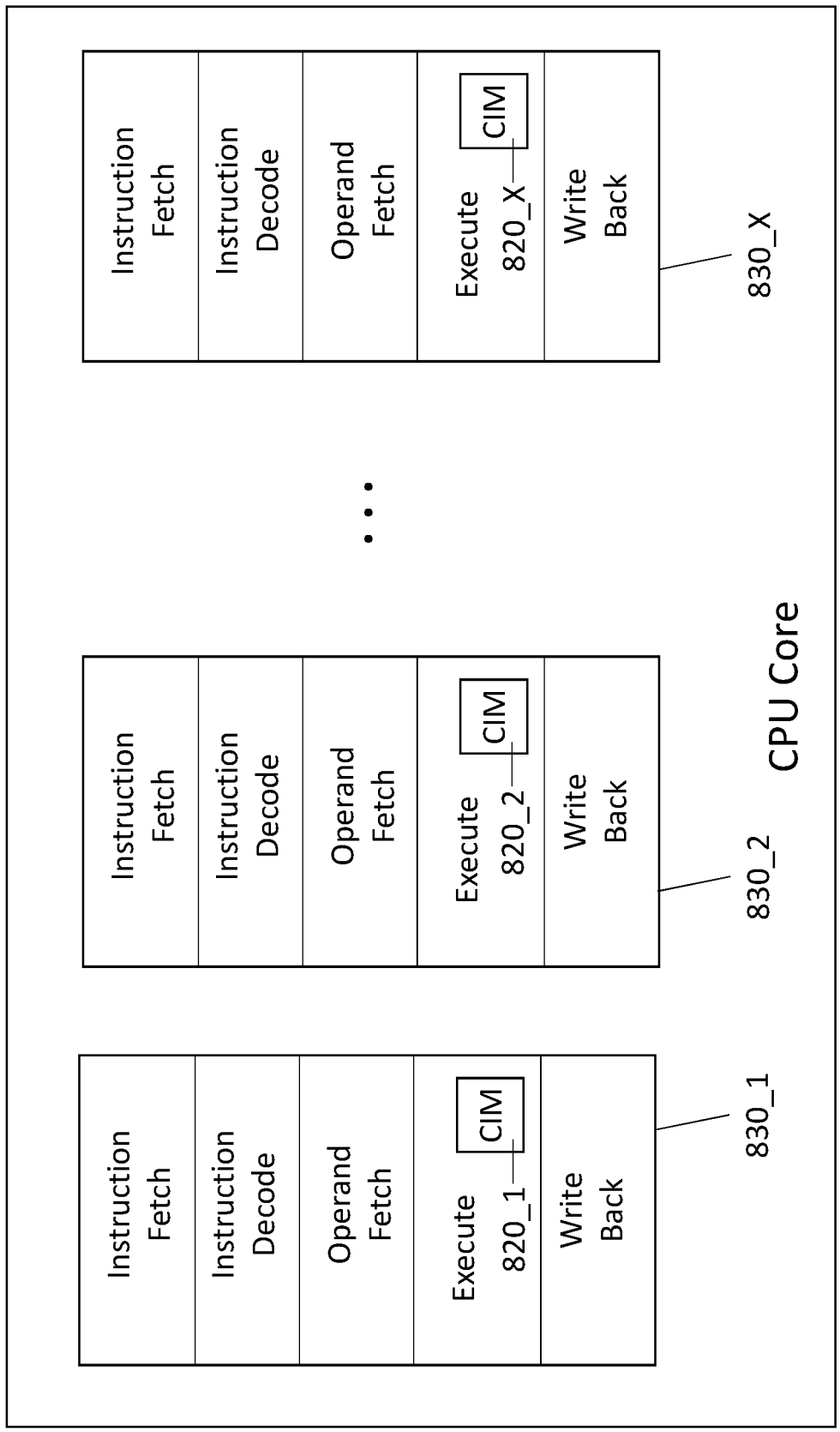

FIGS. 8*a* and 8*b* show different embodiments by which a CIM circuit for implementing a neural network in electronic circuitry, e.g., for artificial intelligence applications, as discussed above, may be integrated into a computing system. FIG. 8*a* shows a first approach in which a CIM circuit 810 is integrated as an accelerator or co-processor to the processor's general purpose CPU processing core(s) 801. Here, an application software program that is executing on one or more of the CPU cores 801 may invoke an artificial intelligence function.

The invocation of the artificial intelligence function may include, e.g., an invocation command that is sent from a CPU core that is executing a thread of the application and is directed to the CIM accelerator 810 (e.g., the invocation command may be supported by the CPU instruction set architecture (ISA)). The invocation command may also be preceded by or may be associated with the loading of configuration information into the CIM hardware 810.

Such configuration information may, e.g., define weights of inter-nodal connections and/or define math functions to be performed by the CIM accelerator's mathematical function circuits. With respect to the later, the CIM accelerator's mathematical function circuits may be capable of performing various math functions and which specific function is to be performed needs to be specially articulated/configured for various math circuits or various sets of math circuits within the CIM accelerator 810 (e.g., the math circuitry configuration may partially or wholly define each neuron's specific math function). The configuration information may be loaded from system main memory and/or non volatile mass storage.

The CIM hardware accelerator 810 may, e.g., have one or more levels of a neural network (or portion(s) thereof) designed into it's hardware. Thus, after configuration of the CIM accelerator 810, input values are applied to the configured CIM's neural network for processing. A resultant is ultimately presented and written back to register space and/or system memory where the executing thread that invoked the CIM accelerator 810 is informed of the completion of the CIM accelerator's neural network processing (e.g., by interrupt). If the number of neural network levels and/or neurons per level that are physically implemented in the CIM hardware accelerator 810 is less than the number of levels/neurons of the neural network to be processed, the processing through the neural network may be accomplished by repeatedly loading the CIM hardware 810 with next configuration information and iteratively processing through the CIM hardware 810 until all levels of the neural network have been processed.

In various embodiments, the CPU cores 810, main memory controller 802, peripheral control hub 803 and last level cache 804 are integrated on a processor semiconductor chip. The CIM hardware accelerator 810 may integrated on the same processor semiconductor chip or may be an off-chip accelerator. In the case of the later, the CIM hardware 810 may still be integrated within a same semiconductor chip package as the processor or disposed on a same interposer with the processor for mounting to, e.g., a larger system motherboard. Further still the accelerator 810 may be coupled to the processor over some kind of external connection interface (e.g., PCIe, a packet network (e.g., Ethernet), etc.). In various embodiments where the CIM accelerator 810 is integrated on the processor it may be tightly coupled with or integrated within the last level cache 804 so that, e.g., it can use at least some of the cache memory resources of the last level cache 804.

FIG. 8b shows an another embodiment in which a CIM execution unit 820 (also referred to as functional unit) is added to the execution units (or functional units) of the instruction execution pipeline(s) 830 of a general purpose CPU processing core. FIG. 8b depicts a single CPU core having multiple instruction execution pipelines 830 where each instruction execution pipeline is enhanced to include a CIM execution unit 820 for supporting neural network/artificial intelligence processing (for simplicity the traditional execution units used to support the traditional ISA are not shown). Here, the ISA of each instruction execution pipeline may be enhanced to support an instruction that invokes the CIM execution unit. The execution of the CIM instruction may be similar to the invocation of the CIM accelerator described just above with respect to FIG. 8b although on a smaller scale.

That is, for instance, the CIM execution unit may include hardware for only a portion of a neural network (e.g., only one or a few neural network levels and/or fewer neurons and/or weighted connection paths actually implemented in hardware). Nevertheless, the processing of multiple neurons and/or multiple weighted connections may be performed in a single instruction by a single execution unit. As such the CIM execution unit and/or the instruction that invokes it may be comparable to a vector or single instruction multiple data (SIMD) execution unit and/or instruction. Further still, if the single instruction and execution unit is able to implement different math functions along different lanes (e.g., simultaneous of execution of multiple neurons having different math functions), the instruction may even be more comparable to that of a multiple instruction (or multiple opcode) multiple data (MIMD) machine.

Connection weight and/or math function definition may be specified as input operand data of the instruction and reside in the register space associated with the pipeline that is executing the instruction. As such, the instruction format of the instruction may define not only multiple data values but possibly also, as alluded to above, not just one opcode but multiple opcodes. The resultant of the instruction may be written back to register space, e.g., in vector form.

Processing over a complete neural network may be accomplished by concurrently and/or sequentially executing a number of CIM execution unit instructions that each process over a different region of the neural network. In the case of sequential execution, a following CIM instruction may operate on the output resultant(s) of a preceding CIM instruction. In the case of simultaneous or at least some degree of concurrent execution, different regions of a same neural network may be concurrently processed in a same time period by different CIM execution units. For example, the neural network may be implemented as a multi-threaded application that spreads the neural network processing over multiple instruction execution pipelines to concurrently invoke the CIM hardware of the different pipelines to process over different regions of the neural network. Concurrent processing per pipeline may also be achieved by incorporating more than one CIM execution unit per pipeline.

Note that although the discussion of FIGS. 1 and 2 suggested that processing a neural network in a traditional CPU environment may be inefficient, introduction of a CIM execution unit as discussed above into one or more CPU cores may greatly alleviate such inefficiency because the CIM execution units are able to consume the information of a neural network at much greater efficiency than a traditional CPU could executing only traditional CPU instructions (e.g., less transfer of information between the CPU core(s) and system memory is effected).

Note that in various embodiments the CIM accelerator of FIG. 8a may be partially or wholly implemented as one or more instruction execution pipelines having one or more CIM execution units capable of executing a CIM instruction as described above with respect to FIG. 8b.

FIG. 9 provides an exemplary depiction of a computing system 900 (e.g., a smartphone, a tablet computer, a laptop computer, a desktop computer, a server computer, etc.). As observed in FIG. 9, the basic computing system 900 may include a central processing unit 901 (which may include, e.g., a plurality of general purpose processing cores 915_1 through 915_X) and a main memory controller 917 disposed on a multi-core processor or applications processor, system memory 902, a display 903 (e.g., touchscreen, flat-panel), a local wired point-to-point link (e.g., USB) interface 904, various network I/O functions 905 (such as an Ethernet interface and/or cellular modem subsystem), a wireless local area network (e.g., WiFi) interface 906, a wireless point-to-point link (e.g., Bluetooth) interface 907 and a Global Positioning System interface 908, various sensors 909_1 through 909_Y, one or more cameras 910, a battery 911, a power management control unit 912, a speaker and microphone 913 and an audio coder/decoder 914.

An applications processor or multi-core processor 950 may include one or more general purpose processing cores 915 within its CPU 901, one or more graphical processing units 916, a memory management function 917 (e.g., a memory controller) and an I/O control function 918. The general purpose processing cores 915 typically execute the operating system and application software of the computing system. The graphics processing unit 916 typically executes graphics intensive functions to, e.g., generate graphics information that is presented on the display 903. The memory control function 917 interfaces with the system memory 902 to write/read data to/from system memory 902. The power management control unit 912 generally controls the power consumption of the system 900.

Each of the touchscreen display 903, the communication interfaces 904-907, the GPS interface 908, the sensors 909, the camera(s) 910, and the speaker/microphone codec 913, 914 all can be viewed as various forms of I/O (input and/or output) relative to the overall computing system including, where appropriate, an integrated peripheral device as well (e.g., the one or more cameras 910). Depending on implementation, various ones of these I/O components may be integrated on the applications processor/multi-core processor 950 or may be located off the die or outside the package of the applications processor/multi-core processor 950. The computing system also includes non-volatile mass storage 920 which may be the mass storage component of the system which may be composed of one or more non volatile mass storage devices (e.g. hard disk drive, solid state drive, etc.).

The computing system may contain a CIM circuit that provides for more than two voltage levels on a read data wire in which distributions of the different voltages on the read wire do not overlap as described in detail by the teachings above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hard interconnected logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
 a compute in memory circuit comprising:
  a memory circuit, the memory circuit to provide $2^m$ voltage levels on a read data line where m is greater than 1, the memory circuit comprising storage cells sufficient to store a number of bits n where n is greater than m;
  an encoder circuit to receive an m bit input and convert the m bit input into an n bit word that is to be stored in the memory circuit, where, the m bit to n bit encoding performed by the encoder circuit creates greater separation between those of the voltage levels that demonstrate wider voltage distributions on the read data line than others of the voltage levels.

2. The apparatus of claim 1 wherein the memory circuit comprises n storage cells.

3. The apparatus of claim 2 wherein the n storage cells separately induce different amounts of voltage change on the read data line.

4. The apparatus of claim 3 where the wider voltage distributions are caused by those of the n storage cells that induce greater amounts of voltage change on the read data line.

5. The apparatus of claim 3 wherein a first storage cell of the n storage cells that is to store a higher ordered bit of the n bit word induces twice the voltage change on the read data line than a second storage cell of the n storage cells that is to store the higher ordered bit's immediate lower ordered bit of the n bit word.

6. The apparatus of claim 1 wherein the memory circuit is comprised of SRAM storage cells.

7. The apparatus of claim 6 wherein the SRAM storage cells are 6T, 8T or 10T SRAM storage cells.

8. The apparatus of claim 1 wherein the read data line is coupled to an analog to digital converter.

9. The apparatus of claim 1 wherein the read data line is coupled to a computation circuit.

10. The apparatus of claim 9 wherein the computation circuit is an analog or mixed signal computation circuit.

11. A computing system, comprising:
 a plurality of CPU processing cores;
 a main memory;
 a main memory controller coupled between the main memory and the plurality of CPU processing cores;
 a solid state drive;
 a compute in memory (CIM) circuit comprising a) and b) below:
  a) a memory circuit, the memory circuit to provide $2^m$ voltage levels on a read data line where m is greater than 1, the memory circuit comprising storage cells sufficient to store a number of bits n where n is greater than m;
  b) an encoder circuit to receive an m bit input and convert the m bit input into an n bit word that is to be stored in the memory circuit, where, the m bit to n bit encoding performed by the encoder circuit creates greater separation between those of the voltage levels that demonstrate wider voltage distributions on the read data line than others of the voltage levels.

12. The computing system of claim 11 wherein the memory circuit comprises n storage cells.

13. The computing system of claim 12 wherein the n storage cells separately induce different amounts of voltage change on the read data line.

14. The computing system of claim 13 where the wider voltage distributions are caused by those of the n storage cells that induce greater amounts of voltage change on the read data line.

15. The computing system of claim 13 wherein a first storage cell of the n storage cells that is to store a higher ordered bit of the n bit word induces twice the voltage change on the read data line than a second storage cell of the n storage cells that is to store the higher ordered bit's immediate lower ordered bit of the n bit word.

16. The computing system of claim 11 wherein the CIM circuit is an accelerator that is coupled to the plurality of CPU processing cores.

17. The computing system of claim 11 wherein the CIM circuit is an execution unit within an instruction execution pipeline of one of the plurality of CPU processing cores.

18. A method performed by a compute-in-memory circuit, comprising:
   receiving an m bit word by an encoder circuit where m is greater than 1;
   converting, by the encoder circuit, the m bit word to an n bit word where n is greater than m;
   storing the n bit word in a memory circuit, the memory circuit to provide $2^m$ voltage levels on a read data wire, where, the n bit to m bit encoding performed by the encoder creates greater separation between those of the voltage levels that demonstrate wider voltage distributions on the read data wire than others of the voltage levels.

19. The method of claim 18 where the compute-in-memory circuit is an accelerator that is coupled to a plurality of CPU processing cores.

20. The method of claim 18 where the compute-in-memory circuit is an execution unit within an instruction execution pipeline of a processor.

\* \* \* \* \*